United States Patent
Bang et al.

(10) Patent No.: US 10,066,315 B2
(45) Date of Patent: Sep. 4, 2018

(54) SINGLE CRYSTAL GROWING APPARATUS

(71) Applicant: SK SILTRON CO., LTD., Gumi-si, Gyeongsangbuk-do (KR)

(72) Inventors: In Sik Bang, Gumi-si (KR); Cheol Hwan Kim, Gumi-si (KR)

(73) Assignee: SK SILTRON CO., LTD., Gumi-si, Gyeongsangbuk-Do (KR)

( * ) Notice: Subject to any disclaimer, the term of this patent is extended or adjusted under 35 U.S.C. 154(b) by 142 days.

(21) Appl. No.: 15/100,597

(22) PCT Filed: Nov. 19, 2014

(86) PCT No.: PCT/KR2014/011109
§ 371 (c)(1),
(2) Date: May 31, 2016

(87) PCT Pub. No.: WO2015/083955
PCT Pub. Date: Jun. 11, 2015

(65) Prior Publication Data
US 2016/0298260 A1 Oct. 13, 2016

(30) Foreign Application Priority Data
Dec. 3, 2013 (KR) .......................... 10-2013-0148977

(51) Int. Cl.
*C30B 17/00* (2006.01)
*C30B 15/14* (2006.01)
(Continued)

(52) U.S. Cl.
CPC .............. *C30B 17/00* (2013.01); *C30B 15/14* (2013.01); *C30B 15/20* (2013.01); *C30B 29/20* (2013.01);
(Continued)

(58) Field of Classification Search
CPC ......... C30B 15/14; C30B 15/20; C30B 15/00; C30B 35/00; C30B 11/006; C30B 15/26;
(Continued)

(56) References Cited

U.S. PATENT DOCUMENTS 5,360,599 A * 11/1994 Cueman ................. C30B 15/14
117/217
5,443,034 A * 8/1995 Everts ..................... C30B 15/14
117/13
(Continued)

FOREIGN PATENT DOCUMENTS

CN 102137959 7/2011
CN 102677168 9/2012
(Continued)

OTHER PUBLICATIONS

Japanese Office Action dated Jul. 14, 2017 issued in Application No. 2016-534893.
(Continued)

*Primary Examiner* — Matthew J Song
(74) *Attorney, Agent, or Firm* — KED & Associates, LLP

(57) ABSTRACT

An embodiment comprises: a chamber; a crucible provided in the chamber and accommodating a molten liquid which is a raw material for single crystal growth; a crucible screen disposed on the upper end of the crucible; and a moving unit for raising or lowering the crucible screen, wherein the crucible screen and a first upper adiabatic unit are raised to control the stroke distance, thereby preventing the impossibility of a lift-off process caused by a shortage of the stroke distance and the generation of cracks in single crystals.

15 Claims, 8 Drawing Sheets

(51) Int. Cl.
   *C30B 35/00* (2006.01)
   *C30B 15/20* (2006.01)
   *C30B 29/20* (2006.01)
   *C30B 11/00* (2006.01)

(52) U.S. Cl.
   CPC ............ *C30B 35/00* (2013.01); *C30B 11/006* (2013.01); *Y10T 117/1004* (2015.01); *Y10T 117/1008* (2015.01)

(58) Field of Classification Search
   CPC ............... C30B 15/28; Y10T 117/1008; Y10T 117/1004
   See application file for complete search history.

(56) References Cited

U.S. PATENT DOCUMENTS

| | | | | |
|---|---|---|---|---|
| 5,450,814 | A * | 9/1995 | Shiraishi | C30B 15/14 117/202 |
| 5,868,836 | A * | 2/1999 | Nakamura | C30B 15/206 117/200 |
| 5,900,059 | A * | 5/1999 | Shimanuki | C30B 15/14 117/217 |
| 5,942,032 | A * | 8/1999 | Kim | C30B 15/14 117/13 |
| 2003/0200915 | A1 * | 10/2003 | Kimura | C30B 15/00 117/84 |
| 2010/0064964 | A1 * | 3/2010 | Hoshi | C30B 15/14 117/15 |
| 2010/0258050 | A1 * | 10/2010 | Hoshi | C30B 15/14 117/217 |

FOREIGN PATENT DOCUMENTS

| | | |
|---|---|---|
| CN | 103147121 | 6/2013 |
| CN | 203007477 | 6/2013 |
| CN | 103215635 | 7/2013 |
| CN | 203034144 | 7/2013 |
| CN | 103361727 | 10/2013 |
| CN | 103409794 | 11/2013 |
| EP | 2 128 310 | 12/2009 |
| JP | H03-247586 | 11/1991 |
| JP | H06-135792 | 5/1994 |
| JP | H06-135792 A | 5/1994 |
| JP | H09-315882 | 12/1997 |
| JP | H11-255576 | 9/1999 |
| JP | 2000-119089 | 4/2000 |
| JP | 2000-327479 | 11/2000 |
| JP | 2001-261494 | 9/2001 |
| JP | 2005-015313 | 1/2005 |
| JP | 2006-069803 | 3/2006 |
| JP | 3849639 B2 | 3/2007 |
| JP | 2008-162809 | 7/2008 |
| JP | 2008-195545 | 8/2008 |
| JP | 2012-091942 A | 5/2012 |
| KR | 10-1293706 B1 | 8/2013 |
| KR | 10-1324827 B1 | 11/2013 |

OTHER PUBLICATIONS

European Search Report dated Jun. 12, 2017 issued in Application No. 14866935.1.
International Search Report (with English Translation) and Written Opinion dated Jan. 14, 2015 issued in Application No. PCT/KR2014/011109.
Chinese Office Action dated Dec. 5, 2017 issued in Application No. 201480066269.8 (English translation attached).

* cited by examiner

SINGLE CRYSTAL GROWING APPARATUS

CROSS-REFERENCE TO RELATED APPLICATIONS

This application is a U.S. National Stage Application under 35 U.S.C. § 371 of PCT Application No. PCT/KR2014/011109, filed Nov. 19, 2014, which claims priority to Korean Patent Application No. 10-2013-0148977, filed Dec. 3, 2013, whose entire disclosures are hereby incorporated by reference.

TECHNICAL FIELD

Embodiments relate to a single crystal growing apparatus.

BACKGROUND ART

Sapphire is a crystal that is generated in such a way that alumina ($Al_2O_3$) is melted at a temperature of 2050° C. and grows while being cooled slowly. As a single crystal of alumina, sapphire has light transmission properties across a wide wavelength range, and also has superior mechanical properties, heat resistance and corrosion resistance, as well as high hardness, heat conductivity, electrical resistance and impact resistance. Since sapphire has no pores and has high dielectric strength, it may be used for a substrate for epitaxial growth.

Representative methods of growing sapphire single crystal include a Verneuil method, an HEM (Heat Exchange Method), an EFG (Edge-Defined Film-Fed Growth), a Czochralski method, and a Kyropulous method.

The Kyropulous method has advantages in that equipment is relatively inexpensive, the manufacturing cost is low, and fewer defects result than when using the Czochralski method. According to the Kyropulous method, although similar to the Czochralski method, a single crystal is grown merely by pulling up the single crystal, without rotation of the single crystal.

DISCLOSURE

Technical Problem

Embodiments provide a single crystal growing apparatus capable of preventing the impossibility of a lift-off process, attributable to an insufficient cycling distance, and preventing the generation of cracks in a single crystal.

Technical Solution

In one embodiment, a single crystal growing apparatus includes: a chamber; a crucible provided in the chamber and accommodating a molten liquid as a raw material for single crystal growth; a crucible screen disposed on a top of the crucible; and a conveying unit for raising or lowering the crucible screen.

The single crystal growing apparatus may further include: a first upper thermal insulation part disposed on the crucible screen; and a second upper thermal insulation part spaced apart from the first upper thermal insulation part and disposed above the first upper thermal insulation part.

The conveying unit may lift up the crucible screen and the first upper thermal insulation part together.

The conveying unit may include: at least one jig for binding the crucible screen and the first upper thermal insulation part together; and a lifting part for raising or lowering the at least one jig.

The at least one jig may include: a binding portion for surrounding the crucible screen and the first upper thermal insulation part together; and a support portion passing through the second upper thermal insulation part and having one end connected to the binding portion and a remaining end connected to the lifting part.

The at least one jig may be provided in a plural number, and the plurality of jigs may be arranged apart from each other.

The at least one jig may pass through the first upper thermal insulation part and the second upper thermal insulation part, and may have one end connected to the crucible screen and a remaining end connected to the lifting part.

The single crystal growing apparatus may further include a controller for controlling the conveying unit so as to adjust a distance between the first upper thermal insulation part and the second upper thermal insulation part.

The controller may include: a growth rate sensor for measuring a growth rate of a growing single crystal; a weight measurement sensor for measuring a weight of the growing single crystal; and a distance measurement sensor for measuring a distance between the growing single crystal and the crucible screen.

The controller may control the conveying unit based on the growth rate of the single crystal measured by the growth rate sensor, the weight of the single crystal measured by the weight measurement sensor, or the distance between the growing single crystal and the crucible screen measured by the distance measurement sensor.

A bottom surface of the first upper thermal insulation part may be in contact with a top surface of the crucible screen.

The conveying unit may raise or lower the crucible screen and the first upper thermal insulation part together within a space between the first upper thermal insulation part and the second upper thermal insulation part.

The binding portion may surround a top surface of the first upper thermal insulation part, outer side surfaces of the crucible screen and the first upper thermal insulation, and at least a portion of a bottom surface of the crucible screen.

In accordance with another embodiment, a single crystal growing apparatus includes: a chamber; a crucible provided in the chamber and accommodating a molten liquid generated by melting a raw material; a crucible screen disposed on a top of the crucible; a first upper thermal insulation part disposed on the crucible screen; a second upper thermal insulation part spaced apart from the first upper thermal insulation part and disposed above the first upper thermal insulation part; a conveying unit for raising or lowering the crucible screen and the first upper thermal insulation part; and a controller for controlling the conveying unit.

The controller may measure a growth rate of the single crystal, compare the measured growth rate of the single crystal with a reference growth rate, and control the conveying unit so as to lift up the crucible screen and the first upper thermal insulation part together based on a comparison result.

If the measured growth rate of the single crystal is greater than the reference growth rate, the controller may lift up the crucible screen and the first upper thermal insulation part together.

The controller may measure a cycling distance of a growing single crystal, compare the measured cycling distance with a predetermined reference distance value, and control the conveying unit so as to lift up the crucible screen and the first upper thermal insulation part together based on a comparison result, and the cycling distance may be a distance by which the growing single crystal can be pulled up until it is brought into contact with the crucible screen.

If the measured cycling distance is less than or equal to the predetermined reference distance value, the controller may lift up the crucible screen and the first upper thermal insulation part together.

The controller may measure a weight of a growing single crystal, compare the measured weight of the single crystal with a predetermined reference weight value, and control the conveying unit so as to lift up the crucible screen and the first upper thermal insulation part together based on a comparison result.

If the measured weight of the single crystal is greater than or equal to the predetermined weight, the controller may lift up the crucible screen and the first upper thermal insulation part together.

The reference growth rate may be 1 kg/hour. The predetermined reference distance value may be one tenth of a maximum cycling distance, and the maximum cycling distance may be a distance between the crucible screen and a boundary surface of the molten liquid. The predetermined reference weight value may be 10 percent of a total weight of the raw material.

Advantageous Effects

Embodiments may prevent the impossibility of a lift-off process, attributable to an insufficient cycling distance, and may prevent the generation of cracks in a single crystal.

BEST MODE

Figure 1:
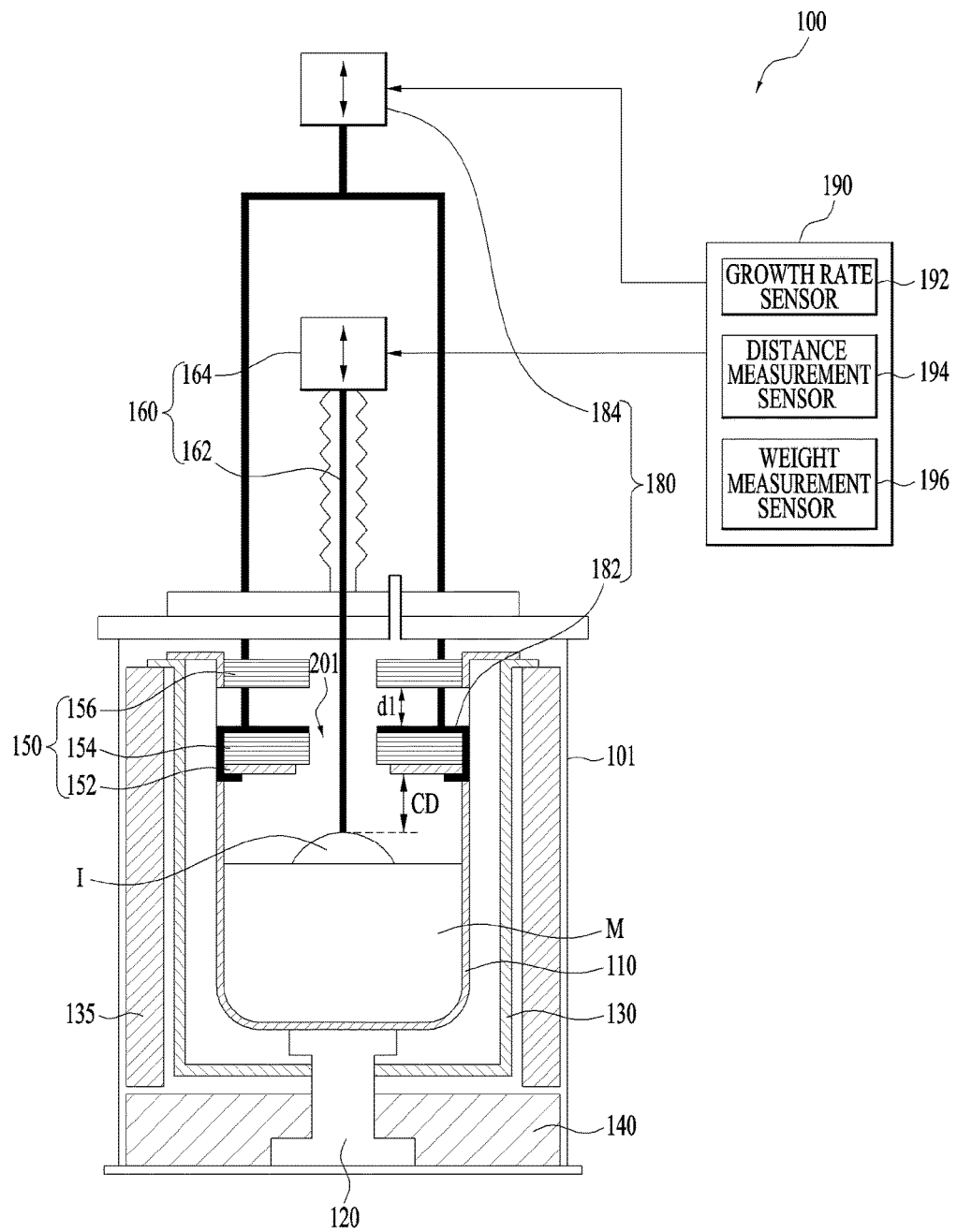
FIG. 1 shows a single crystal growing apparatus according to an embodiment.

Hereinafter, embodiments will be clearly revealed via description thereof with reference to the accompanying drawings. In the following description of the embodiments, it will be understood that, when an element such as a layer (film), region, pattern, or structure is referred to as being "on" or "under" another element, it can be "directly" on or under another element or can be "indirectly" formed such that an intervening element may also be present. In addition, it will also be understood that criteria of on or under is on the basis of the drawings.

In the drawings, dimensions are exaggerated, omitted or schematically illustrated for description convenience and clarity. In addition, dimensions of constituent elements do not entirely reflect actual dimensions. Wherever possible, the same reference numbers will be used throughout the drawings to refer to the same or like parts. Hereinafter, a single crystal growing apparatus according to the embodiments will be described with reference to the accompanying drawings.

FIG. 1 shows a single crystal growing apparatus 100 according to an embodiment.

Referring to FIG. 1, the single crystal growing apparatus 100 includes a chamber 101, a crucible 110, a crucible support 120, a heater 130, a side thermal insulation part 135, a lower thermal insulation part 140, a crucible screen 152, a first upper thermal insulation part 154, a second upper thermal insulation part 156, a first conveying unit 162, a second conveying unit 180, and a controller 190.

For example, the single crystal growing apparatus 100 may be an apparatus for growing a sapphire single crystal using the Kyropulous method, but the embodiment is not limited to this single crystal growing apparatus.

The chamber 101 may be a space for providing an environment for growing a single crystal I or a single crystal boule. Although the term "single crystal" will be used hereinafter, it may also refer to a single crystal boule.

The crucible 110 may be disposed in the chamber 101, and may have a structure into which a raw material is charged and which accommodates molten liquid M generated by melting the charged raw material. The material of the crucible 110 may be tungsten (W), but the embodiment is not limited to tungsten.

The crucible support 120 may be disposed under the crucible 110 in order to support the crucible 110. The crucible support 120 may be made of a material having superior heat conductivity and heat resistance and a low thermal expansion rate, e.g. molybdenum (Mo), which is not easily deformed by heat and has high resistance to thermal shocks, but the embodiment is not limited to molybdenum.

The heater 130 may be disposed in the chamber 101 while being spaced a predetermined distance from the outer circumferential surface of the crucible 110, and may heat the crucible 110. The heater 130 may be made of tungsten, but the embodiment is not limited to tungsten.

The heater 130 may be arranged to surround the side surface and the bottom surface of the crucible 110, but the embodiment is not limited to this arrangement, and the heater may be arranged only around the side surface of the crucible 110.

The heater 130 may heat the crucible 110, and the temperature in the crucible 110 may rise due to heat from the heater 130, thereby changing a raw material, which is a polycrystalline ingot, into the molten liquid M.

The side thermal insulation part 135 may be disposed near the side portion of the crucible 110, and may prevent the heat in the chamber 101 from escaping through the side portion of the chamber 101. For example, the side thermal insulation part 135 may be positioned between the heater 130 and the side wall of the chamber 101, and may prevent the heat from the heater 130 from leaking to the outside of the chamber 101.

The lower thermal insulation part 140 may be disposed under the crucible 110, and may prevent the heat in the chamber 101 from escaping through the lower portion of the chamber 101. For example, the lower thermal insulation part 140 may be positioned between the heater 130 and the bottom of the chamber 101, and may prevent the heat from the heater 130 from escaping through the bottom of the chamber 101.

The crucible screen 152, the first upper thermal insulation part 154 and the second upper thermal insulation part 156 may be disposed on the crucible 110, and may prevent the heat from escaping through the upper portion of the crucible 110.

Each of the crucible screen 152, the first upper thermal insulation part 154 and the second upper thermal insulation part 156 may have an opening 201 formed in the center thereof. A seed crystal connected to a seed connecting part 162 may pass through the opening 201, and may contact the molten liquid M in the crucible 110.

For example, each of the crucible screen 152, the first upper thermal insulation part 154 and the second upper thermal insulation part 156 may have a circular plate shape having an opening 201 formed in the center thereof, but the shape is not limited to a circular plate shape, and may be determined according to the shape of the crucible 110. The opening 201 may have a circular shape having a certain diameter, but the shape is not limited to a circular shape, and may be a polygonal or oval shape.

The crucible screen 152 may be arranged at the top of the crucible 110, and may reflect radiant heat, which is generated from the molten liquid M contained in the crucible 110, toward the crucible 110.

The crucible screen 152 may be embodied as a single layer, made of molybdenum or tungsten (W) having a good insulation effect. The thickness of the crucible screen 152 may range from 5 mm to 10 mm, but it is not limited to this size.

The first upper thermal insulation part 154 may be disposed on the crucible screen 152. For example, the bottom surface of the first upper thermal insulation part 154 may be in contact with the top surface of the crucible screen 152.

The second upper thermal insulation part 156 may be disposed above the first upper thermal insulation part 154 so as to be spaced a predetermined distance d1 from the first upper thermal insulation part 154. For example, the distance d1 may range from 50 mm to 100 mm, but it is not limited to this size.

Each of the first and second upper thermal insulation parts 154 and 156 may have a structure such that a plurality of layers is stacked, and an air gap for insulation may exist between the adjacent layers.

For example, each of the first and second upper thermal insulation parts 154 and 156 may include a first layer, which is located at the lowermost position, and a plurality of second layers, which are stacked on the first layer.

The first layer may be made of tungsten, and the plurality of second layers may be made of molybdenum. In order to improve the insulation effect, the number of second layers included in the second upper thermal insulation part 156 may be greater than the number of second layers included in the first upper thermal insulation part 154.

The first upper thermal insulation part 154 may be supported by the crucible screen 152, and the second upper thermal insulation part 156 may be supported by the top of the heater 130, but the embodiment is not limited to this support structure.

The first conveying unit 160 may include a seed connecting part 162 and a first lifting part 164. The seed connecting part 162 may be disposed above the crucible 110, and may have one end to which a seed crystal is secured and the other end which is connected to the first lifting part 164. The seed connecting part 162 may be of a shaft type, but it is not limited to the shaft type.

The first lifting part 164 may be connected with the seed connecting part 162, and may raise or lower the seed connecting part 162 in the chamber 101.

The second conveying unit 180 may raise or lower the crucible screen 152 and the first upper thermal insulation part 154.

For example, the second conveying unit 180 may raise or lower the crucible screen 152 and the first upper thermal insulation part 154 together within the space between the first upper thermal insulation part 154 and the second upper thermal insulation part 156, which are spaced apart from each other.

The second conveying unit 180 may include at least one jig 182 for binding the crucible screen 152 and the first upper thermal insulation part 154 together, and a second lifting part 184 for raising or lowering the at least one jig 182.

Figure 2A:
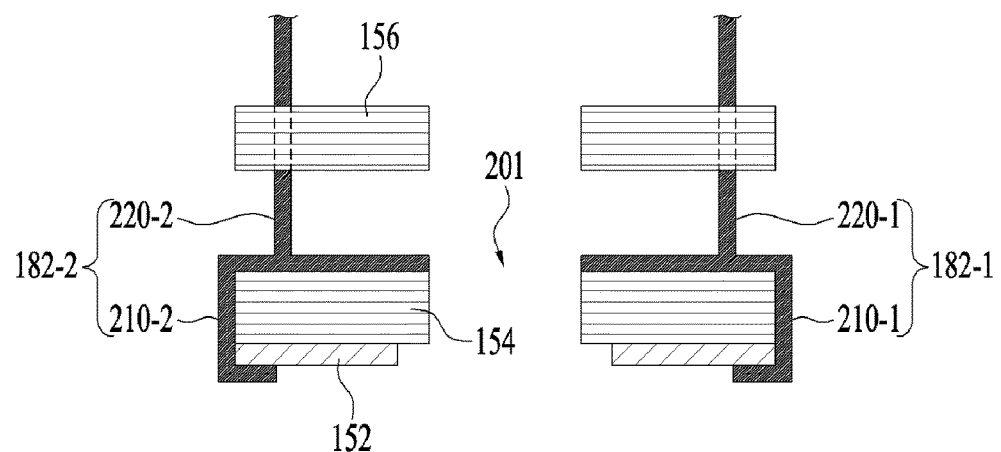
FIG. 2a shows an embodiment of the jig depicted in FIG. 1.

FIG. 2a shows an embodiment 182-1 and 182-2 of the jig 182 depicted in FIG. 1.

Referring to FIG. 2a, the at least one jig 182 may include a first jig 182-1 and a second jig 182-2, which are spaced apart from each other. Although two jigs are illustrated in FIG. 2a, the number of jigs is not limited to two.

The at least one jig, e.g. 182-1 and 182-2, may include a binding portion, e.g. 210-1 and 210-2, for surrounding the crucible screen 152 and the first upper thermal insulation part 154 together, and a support portion, e.g. 220-1 and 220-2, which passes through the second upper thermal insulation part 156, the support portion having one end connected to the binding portion, e.g. 210-1 and 210-2, and the other end connected to the second lifting part 184.

For example, the first jig 182-1 may include a first binding portion 210-1 for surrounding a portion of the crucible screen 152 and a portion of the first upper thermal insulation part 154 together, and a first support portion 220-1, which passes through the second upper thermal insulation part 156, the first support portion having one end connected to the first binding portion 210-1 and the other end connected to the second lifting part 184.

The second jig 182-2 may include a second binding portion 210-2 for surrounding another portion of the crucible screen 152 and another portion of the first upper thermal insulation part 154 together, and a second support portion 220-2, which passes through the second upper thermal insulation part 156, the second support portion having one end connected to the second binding portion 210-2 and the other end connected to the second lifting part 184.

For instance, each of the first and second binding portions 210-1 and 210-2 may surround the top surface of the first upper thermal insulation part 154, the outer side surfaces of the crucible screen 152 and the first upper thermal insulation part 154, and at least a portion of the bottom surface of the crucible screen 152.

Alternatively, the binding portions of the plurality of jigs may be connected to each other. Also, the support portions may not pass through the second upper thermal insulation part 156, and the number of support portions is not limited to the number illustrated in FIG. 2a.

Figure 2B:
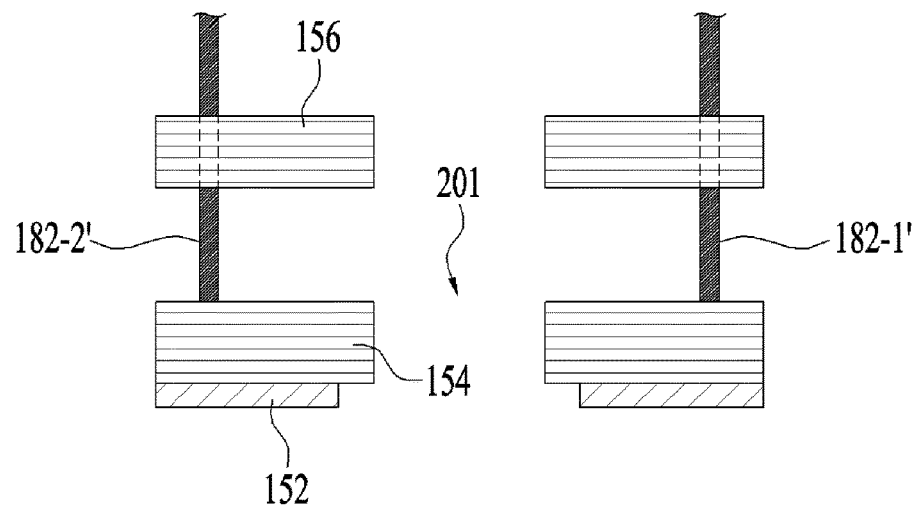
FIG. 2b shows another embodiment of the jig depicted in FIG. 1.

FIG. 2b shows another embodiment 182-1' and 182-2' of the jig 182 depicted in FIG. 1.

Referring to FIG. 2b, at least one jig, e.g. 182-1' and 182-2' may pass through the first upper thermal insulation part 154 and the second upper thermal insulation part 156, and may have one end connected to the crucible screen 152 and the other end connected to the second lifting part 184.

For example, a first jig, e.g. 182-1', may pass through the first upper thermal insulation part 154 and the second upper thermal insulation part 156 so that one end thereof is connected to a region of the top surface of the crucible screen 152 and the other end thereof is connected to the second lifting part 184.

Also, a second jig, e.g. 182-2', may pass through the first upper thermal insulation part 154 and the second upper thermal insulation part 156 so that one end thereof is connected to another region of the top surface of the crucible screen 152 and the other end thereof is connected to the second lifting part 184.

The controller 190 may control the operation of the first conveying unit 160 and the second conveying unit 180.

The controller 190 may control the first lifting part 164 so as to raise or lower the seed connecting part 162.

The controller 190 may also control the second lifting part 184 so as to raise or lower the jig 182, thereby adjusting the distance between the crucible screen 152 and the top of the single crystal while the single crystal is grown.

As the distance between the crucible screen 152 and the top of the single crystal that is being grown is adjusted, the cycling distance may be adjusted. That is, the cycling distance may be the distance by which the grown single crystal can be pulled up until it is brought into contact with the crucible screen.

For example, the cycling distance when the seed crystal is immersed in the molten liquid may be the distance between the crucible screen and the boundary surface of the molten liquid, and the cycling distance at this time may be the maximum cycling distance of the single crystal.

Figure 3:
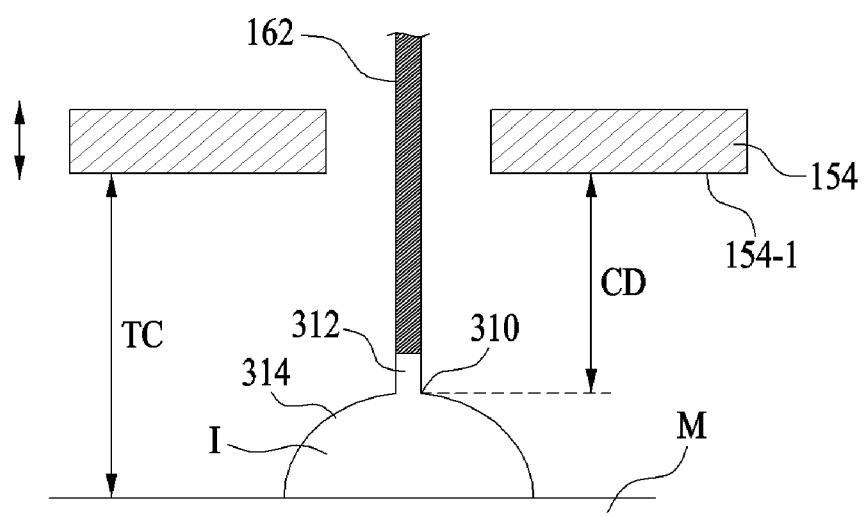
FIG. 3 shows a cycling distance between a grown single crystal and a crucible screen depicted in FIG. 1.

FIG. 3 shows the cycling distance CD between the grown single crystal I and the crucible screen 152 shown in FIG. 1.

Referring to FIG. 3, the grown single crystal I may be divided into a neck, a shoulder and a body.

The neck may be a thin and long portion that is grown from the seed crystal, the shoulder may be a portion that is grown by gradually increasing the diameter of the single crystal ingot to a target diameter, and the body may be a grown portion having a certain target diameter.

The cycling distance TC from when the seed crystal is immersed in the molten liquid to when the neck of the single crystal I has been grown may be the distance between the crucible screen 152 and the boundary surface of the molten liquid M. Hereinafter, TC will be referred to as a "maximum cycling distance".

The cycling distance CD when the shoulder or body of the single crystal has been grown may be the distance between the interface 310 between the neck 312 and the shoulder 314 of the single crystal and the bottom surface 1521 of the crucible screen 152.

As the single crystal I is grown, the single crystal I may be gradually pulled up by the first lifting part 164. For example, during the growth of the single crystal I, the single crystal I may be pulled up at a constant rate by the first lifting part 164.

In order to perform a lift process to separate the single crystal, which has been almost completely grown, from the crucible, a minimal cycling distance is required.

However, in the case in which a growth rate of the single crystal is low in the beginning stage or in which side sticking occurs and thus a process of melting the side sticking portion is performed, the run time is increased, and accordingly the cycling distance CD for performing the lift-off process may be insufficient. If the lift-off process cannot be performed due to the insufficient cycling distance CD, the possibility that cracks are formed in the lower portion of the single crystal may be over 90 percent, and the single crystal and the crucible may be adhered to each other, which makes it impossible to remove the single crystal.

The embodiment is characterized in that the jig 182 is lifted up by the second lifting part 184 during the growth of the single crystal, thereby securing a sufficient cycling distance and a stable lift-off distance and preventing the generation of cracks.

Figure 4A:
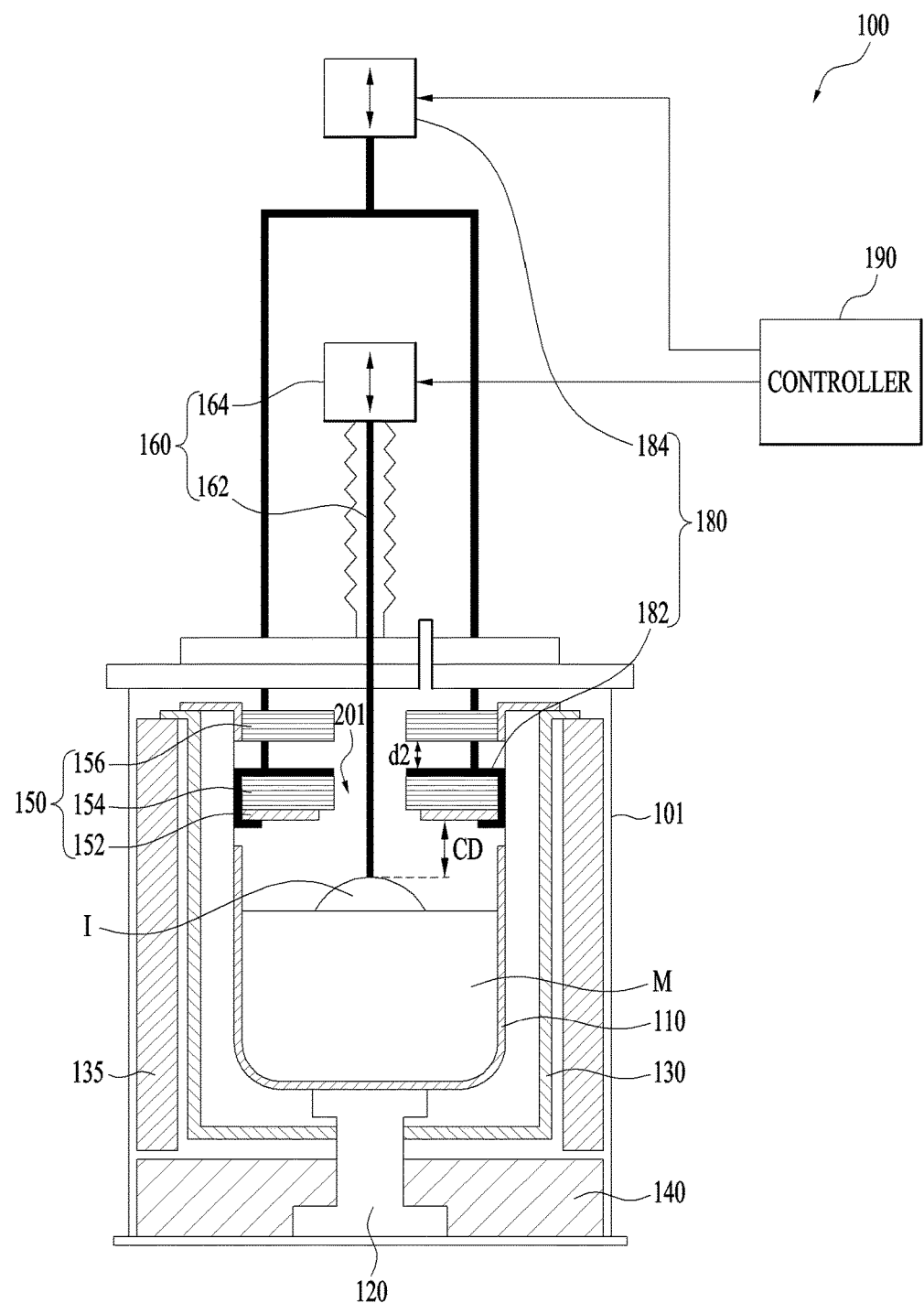
FIGS. 4a and 4b show a distance between a first upper thermal insulation part and a second upper thermal insulation part according to rising of the jig.
Figure 4B:
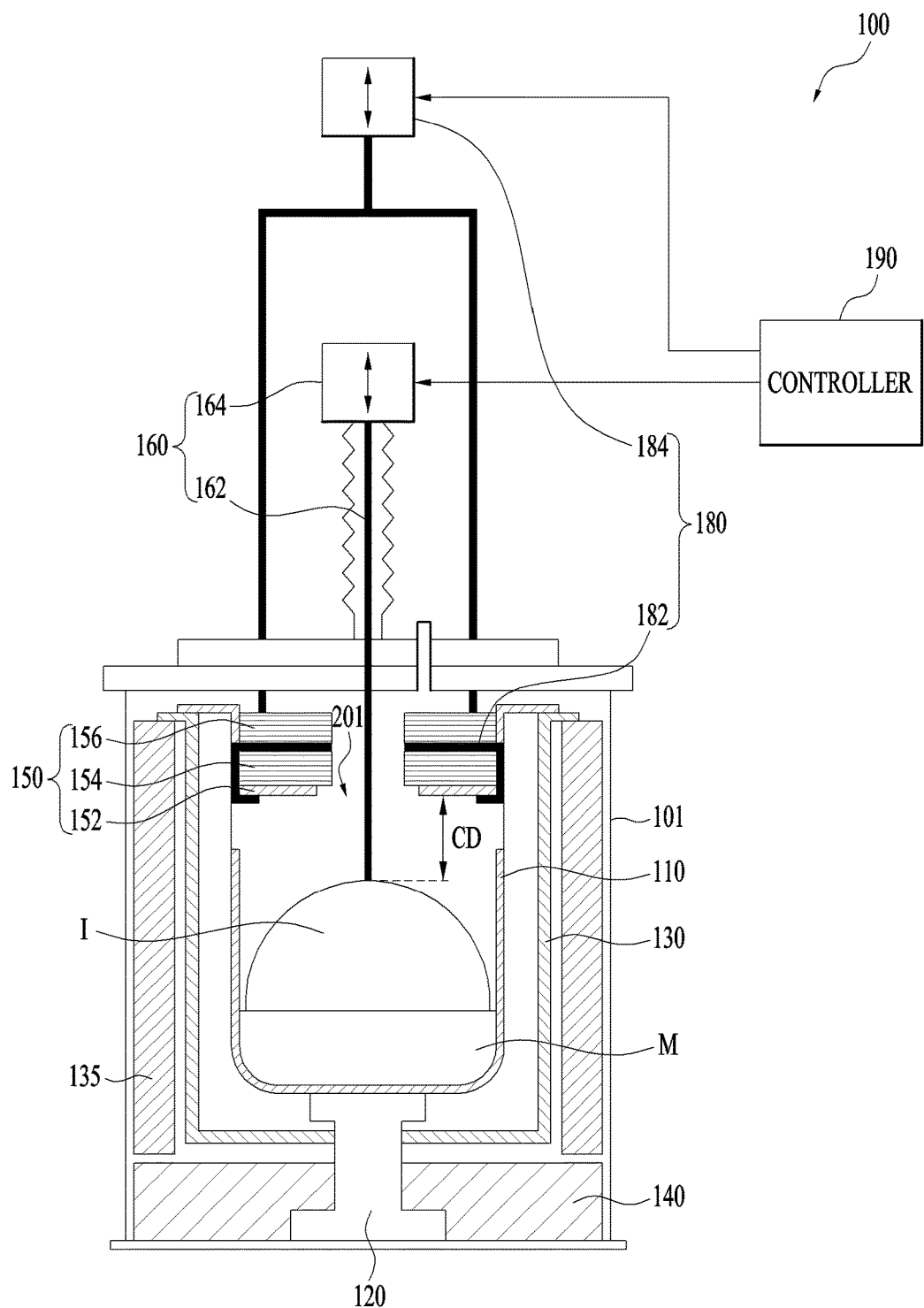

FIGS. 4a and 4b show the distance between the first upper thermal insulation part 154 and the second upper thermal insulation part 156 according to the rising of the jig 182.

The controller 190 may control the second lifting part 184 of the second conveying unit 180 so as to adjust the distance between the first upper thermal insulation part 154 and the second upper thermal insulation part 156. For example, the distance between the first upper thermal insulation part 154 and the second upper thermal insulation part 156 may be adjusted by raising or lowering the at least one jig 182 using the second lifting part 184.

As an example, referring to FIG. 1, when the jig 182 is not lifted up at all, the distance d1 between the first upper thermal insulation part 154 and the second upper thermal insulation part 156 may be the greatest.

When the jig 182 is not lifted up at all, the jig 182 or the crucible screen 152 may be in contact with the top of the crucible 110.

As shown in FIG. 4a, as the at least one jig 182 is lifted up by the second lifting part 184, the distance d2 between the first upper thermal insulation part 154 and the second upper thermal insulation part 156 may become smaller than the distance d1 shown in FIG. 1 (d2<d1).

As also shown in FIG. 4b, as the at least one jig 182 is lifted up, the jig 182 may be brought into contact with the second upper thermal insulation part 156, and the distance between the first upper thermal insulation part 154 and the second upper thermal insulation part 156 may become 0.

For example, the at least one jig 182 may be lifted up until the binding portion 210-1 and 210-2 of the jig 182 is brought into contact with the bottom surface of the second upper thermal insulation part 156.

The controller 190 may measure the growth rate of the single crystal, compare the measured growth rate of the single crystal with a reference growth rate, and control the second conveying unit 180 so as to lift up the crucible screen 152 and the first upper thermal insulation part 154 based on the comparison result. The controller 190 may include a growth rate sensor 192 for measuring the growth rate of the single crystal.

The reference growth rate may be a criterion determined based on whether side sticking or screen contact occurs. For example, the reference growth rate may be 1 kg/hour, but it is not limited to this rate.

As an example, if the measured growth rate of the single crystal is greater than the reference growth rate (e.g. 1 kg/hour), the controller 190 may control the second conveying unit 180 so as to lift up the crucible screen 152 and the first upper thermal insulation part 154.

Alternatively, the controller 190 may measure the cycling distance of the growing single crystal, compare the measured cycling distance of the single crystal with a predetermined reference distance value, and control the second conveying unit 180 so as to lift up the crucible screen 152 and the first upper thermal insulation part 154 based on the comparison result. The controller 190 may include a distance measurement sensor 194 for measuring the cycling distance.

As an example, if the measured cycling distance of the single crystal is equal to or less than the predetermined reference distance value, the controller 190 may control the second conveying unit 180 so as to lift up the crucible screen 152 and the first upper thermal insulation part 154.

As an example, the predetermined reference distance value may be one tenth of the maximum cycling distance TC (refer to FIG. 3).

Alternatively, the controller 190 may measure the weight of the growing single crystal, compare the measured weight of the single crystal with a predetermined reference weight value, and control the second conveying unit 180 so as to lift up the crucible screen 152 and the first upper thermal insulation part 154 based on the comparison result. The controller 190 may include a weight measurement sensor 196 for measuring the weight of the growing single crystal.

Herein, the predetermined reference weight value may be the weight of the single crystal at the point in time at which the shoulder has been completely formed. For instance, the predetermined reference weight value may be 10 percent of the total weight of the charged raw material.

The embodiment is characterized in that, since the cycling distance can be adjusted by raising the crucible screen 152 and the first upper thermal insulation part 154, it is possible to prevent the impossibility of the lift-off process, attributable to an insufficient cycling distance, and to prevent the generation of cracks in the single crystal.

Figure 5:
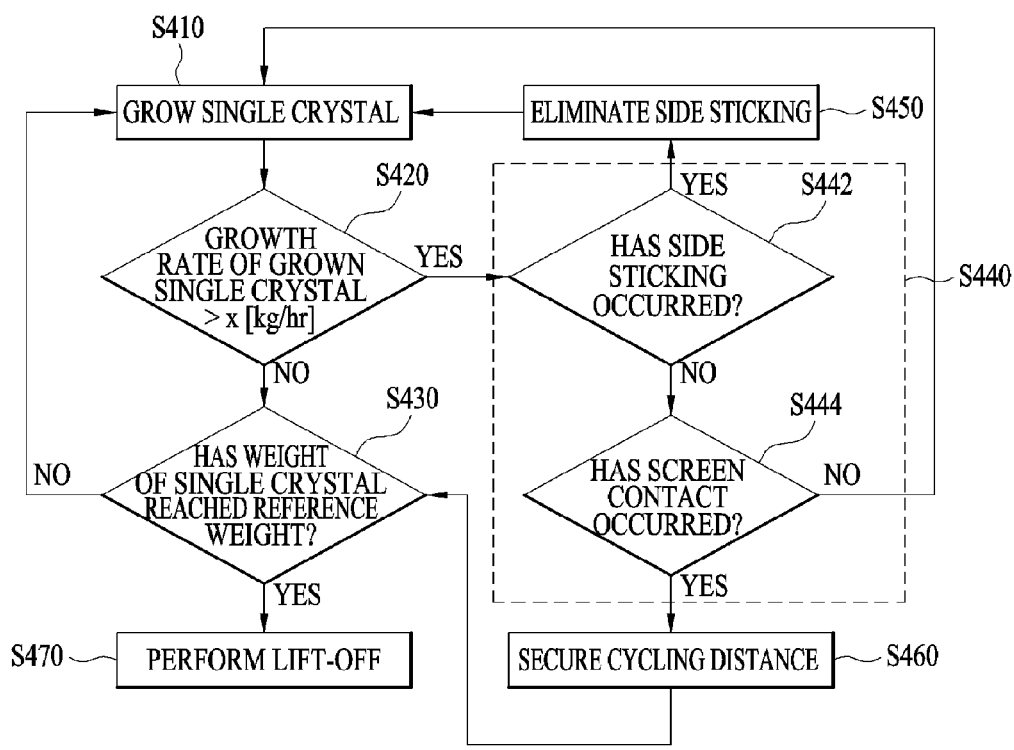
FIG. 5 shows a flowchart of a single crystal growing method according to an embodiment.

FIG. 5 shows a flowchart of a single crystal growing method according to an embodiment.

Referring to FIG. 5, first, single crystal growth is started using the single crystal growing apparatus shown in FIG. 1 (S410).

As an example, a polycrystalline raw material is charged into the crucible 110, and is melted by heating the crucible 110 using the heater 130, thereby making the molten liquid M.

A seed crystal connected to the seed connecting part 162 is lowered down using the first lifting part 164, and is brought into contact with the molten liquid M.

The single crystal is grown through a necking process for forming a neck from the seed crystal, a shouldering process for forming a shoulder, and a body process for forming a body.

Next, the growth rate of the growing single crystal I is measured, and the measured growth rate of the single crystal I is compared with a reference growth rate x (S420). The reference growth rate may be a criterion determined based on whether side sticking or screen contact occurs.

Herein, the side sticking means that the growing single crystal comes into contact with the inner side surface of the crucible 110 and sticks thereto, and the screen contact means that the growing single crystal comes into contact with the bottom surface of the crucible screen and sticks thereto.

For example, the reference growth rate x may be 1 kg/hour, but it is not limited to this rate.

If the growth rate of the single crystal is less than or equal to the reference growth rate x, the weight of the grown single crystal is measured, and it is determined whether the measured weight of the single crystal has reached the predetermined reference weight (430). For example, the predetermined reference weight may be the weight of the charged raw material.

If the weight of the grown single crystal has reached the predetermined weight, a lift-off process for removing the grown single crystal from the crucible 110 is performed (S470).

If the weight of the grown single crystal has not reached the predetermined reference weight, the single crystal continues to be grown (S410).

On the other hand, if the growth rate of the single crystal is greater than the reference growth rate x, it is determined whether screen contact or side sticking has occurred (S440), and if side sticking has occurred, the side-sticking portion is eliminated, whereas if screen contact has occurred, the crucible screen 152 and the first upper thermal insulation part 154 are lifted up using the second conveying unit 180, thereby securing the cycling distance (S460).

As an example, if the growth rate of the single crystal is greater than the reference growth rate x, it is determined whether side sticking has occurred (S442), and if side sticking has occurred, the side-sticking portion is eliminated by melting the side-sticking portion (450). If side sticking has not occurred, it is determined whether screen contact has occurred (S444). If screen contact has occurred, the crucible screen 152 and the first upper thermal insulation part 154 are lifted up using the second conveying unit 180, thereby securing the cycling distance (S460), and the step S430 is performed after the cycling distance is secured. For example, the crucible screen 152 and the first upper thermal insulation part 154 may be lifted up more than the minimum cycling distance that is required in order to perform the lift-off process. As an example, the cycling distance required to perform the lift-off process may be 10 mm or more.

On the other hand, if the screen contact has not occurred, the single crystal continues to be grown (S410).

Figure 6:
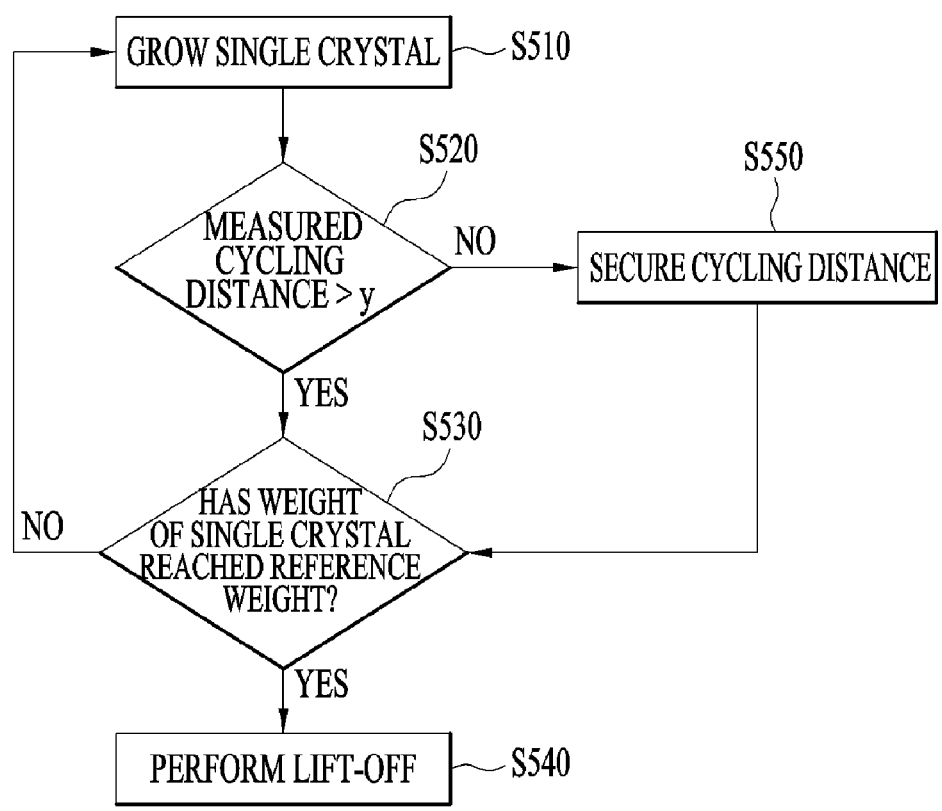
FIG. 6 shows a flowchart of a single crystal growing method according to another embodiment.

FIG. 6 shows a flowchart of a single crystal growing method according to another embodiment.

Referring to FIG. 6, a single crystal is grown using the single crystal growing apparatus shown in FIG. 1 (S510).

Next, the cycling distance of the growing single crystal is measured, and the measured cycling distance is compared with a predetermined reference distance value y (S520).

Herein, the cycling distance of the single crystal may be the distance between the single crystal and the crucible screen, for example, the distance between the interface between the neck and the shoulder of the single crystal and the crucible screen.

As an example, the predetermined reference distance value may be one tenth of the maximum cycling distance TC (refer to FIG. 3).

If the measured cycling distance is greater than the predetermined reference value y, it is determined whether the weight of the grown single crystal has reached a predetermined reference weight (530). For example, the predetermined reference weight may be the total weight of the charged raw material.

If the weight of the grown single crystal has reached the predetermined reference weight, a lift-off process for removing the grown single crystal from the crucible 110 is performed (S540).

On the other hand, if the weight of the grown single crystal has not reached the predetermined reference weight, the single crystal continues to be grown (S510).

If the measured cycling distance is less than or equal to the predetermined reference distance value y, the crucible screen 152 and the first upper thermal insulation part 154 are lifted up using the second conveying unit 180, thereby securing the cycling distance (S550), and the step S530 is performed after the cycling distance is secured.

The crucible screen 152 and the first upper thermal insulation part 154 may be lifted up, so that the cycling distance becomes greater than the predetermined reference distance value y.

As an example, if the total cycling distance TC is 50 mm, the predetermined reference distance value y may be 5 mm, and if the measured cycling distance is 5 mm or less, the crucible screen 152 and the first upper thermal insulation part 154 may be lifted up, so that the cycling distance becomes 10 mm or more.

Figure 7:
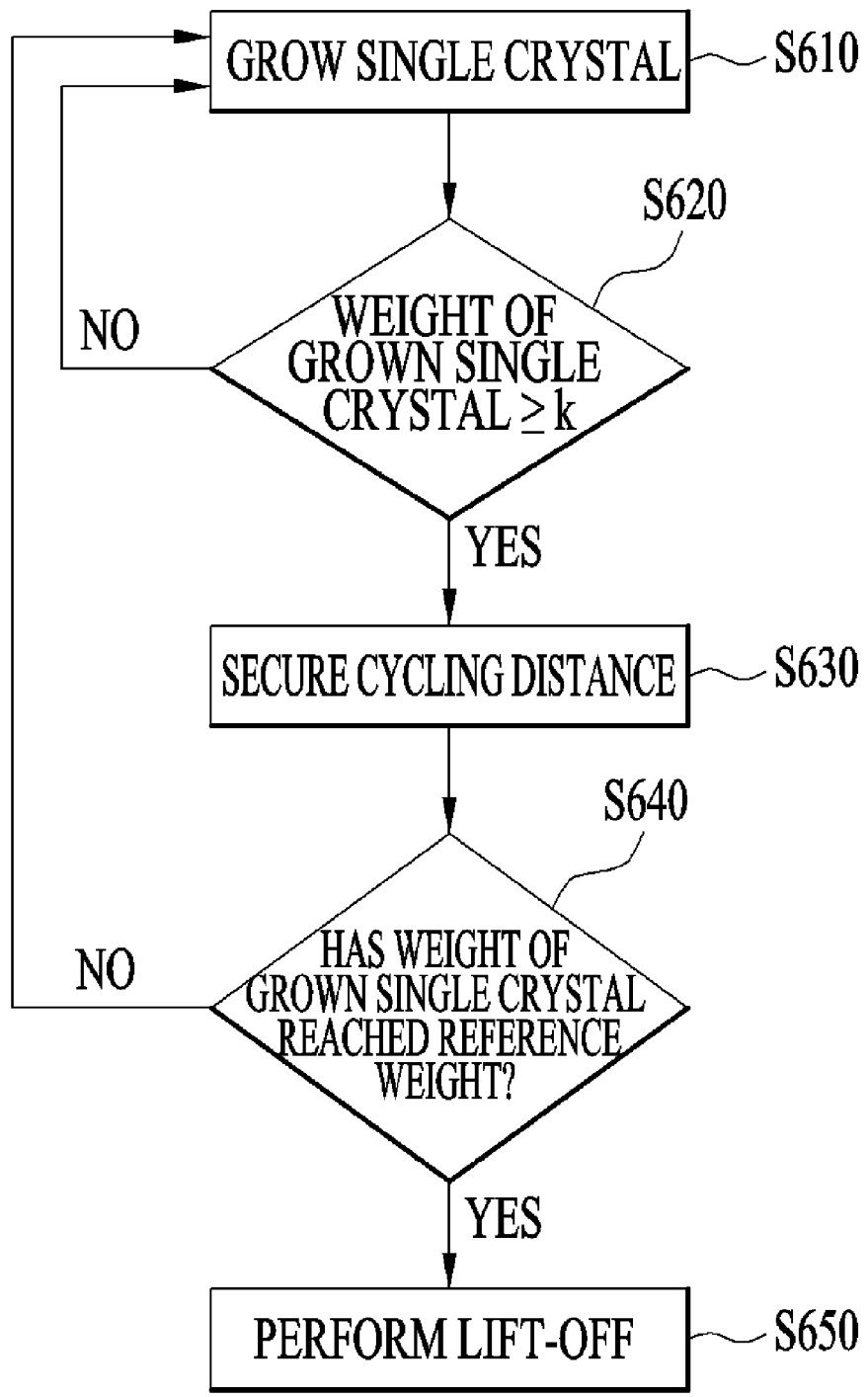
FIG. 7 shows a flowchart of a single crystal growing method according to a further embodiment.

FIG. 7 shows a flowchart of a single crystal growing method according to a further embodiment.

Referring to FIG. 7, single crystal growth is started using the single crystal growing apparatus shown in FIG. 1 (S610).

Next, the weight of the growing single crystal is measured, and the measured weight of the single crystal is compared with a predetermined reference weight value k (S620).

Herein, the predetermined reference weight value k may be the weight of the single crystal at the point in time at which the shoulder has been completely formed. For instance, the predetermined reference weight value k may be 10 percent of the total weight of the charged raw material.

If the measured weight of the single crystal is less than the predetermined reference weight value k, the single crystal continues to be grown (S610).

On the other hand, if the measured weight of the single crystal is greater than or equal to the predetermined reference weight value k, the crucible screen 152 and the first upper thermal insulation part 154 are lifted up using the second conveying unit 180, thereby securing the cycling distance (S630).

After the cycling distance is secured, it is determined whether the weight of the grown single crystal has reached a predetermined reference weight of the raw material (S640). For instance, the predetermined reference weight may be the total weight of the charged raw material.

If the weight of the grown single crystal has reached the predetermined reference weight, a lift-off process for removing the grown single crystal from the crucible 110 is performed (S650).

On the other hand, if the weight of the grown single crystal has not reached the predetermined reference weight, the single crystal continues to be grown (S610).

In the embodiment shown in FIG. 7, the lifting of the crucible screen 152 and the first upper thermal insulation part 154 to secure the cycling distance is performed after the shoulder of the single crystal has been completely formed.

When the crucible screen 152 and the first upper thermal insulation part 154 are lifted up, because the crucible screen 152 is separated from the crucible, a gap is formed between the crucible screen 152 and the crucible 110, through which heat escapes, and accordingly the thermal balance of the molten liquid M in the crucible 110 may be broken. Further, because there is the possibility that oxygen will be introduced into the molten liquid M through the gap, the quality of the growing single crystal may be deteriorated.

However, after the shoulder of the single crystal is completely formed, although the crucible screen 152 and the first upper thermal insulation part 154 are lifted up, the already formed shoulder can prevent the heat from escaping to the outside of the crucible 110, or can prevent oxygen from entering the crucible 110.

Accordingly, the embodiment shown in FIG. 7 is characterized in that the cycling distance is secured after the shoulder of the single crystal is completely formed, thereby preventing the collapse of thermal balance or the inflow of oxygen and consequently preventing deterioration in the quality of the single crystal.

The characteristics, configurations, effects, and the like described in the above embodiments are included in at least one embodiment of the present invention, but are not essentially limited to only one embodiment. It will be apparent to those skilled in the art that various modifications or combinations of the characteristics, configurations, effects, and the like exemplified in the respective embodiments can be made. Thus, it should be analyzed that all contents related to these modifications or combinations belong to the range of the present invention.

INDUSTRIAL APPLICABILITY

Embodiments may be used for a single crystal growing process of a wafer manufacturing process.

The invention claimed is:

1. A single crystal growing apparatus comprising:
   a chamber;
   a crucible provided in the chamber and accommodating a molten liquid as a raw material for single crystal growth;
   a crucible screen disposed on a top of the crucible;
   a first upper thermal insulation part disposed on the crucible screen;
   a second upper thermal insulation part spaced apart from the first upper thermal insulation part and disposed above the first upper thermal insulation part;
   a conveying unit for raising or lowering the crucible screen and the first upper thermal insulation part together; and
   a controller for controlling the conveying unit so as to adjust a distance between the first upper thermal insulation part and the second upper thermal insulation part,
   wherein the controller measures a cycling distance of a growing single crystal, compares the measured cycling distance with a predetermined reference distance value, and controls the conveying unit so as lift up the crucible screen and the first upper thermal insulation part together based on a comparison result, and
   the cycling distance is a distance by which the growing single crystal can be pulled up until it is brought into contact with the crucible screen.

2. The single crystal growing apparatus according to claim 1,
   wherein, if the measured cycling distance is less than or equal to the predetermined reference distance value, the controller lifts up the crucible screen and the first upper thermal insulation part together.

3. The single crystal growing apparatus according to claim 2, wherein the controller secures the cycling distance by lifting up the crucible screen and the first upper thermal insulation part together.

4. The single crystal growing apparatus according to claim 1, wherein the predetermined reference distance value is one tenth of maximum cycling distance, and the maximum cycling distance is a distance between the crucible screen and a boundary surface of the molten liquid.

5. The single crystal growing apparatus according to claim 2,
   wherein if the measured cycling distance is greater than the predetermined reference distance value, the controller determines whether a weight of a grown single crystal has reached a predetermined reference weight, and the predetermined reference weight is a total weight of the raw material.

6. The single crystal growing apparatus according to claim 1, wherein the controller includes:
   a measurement sensor for measuring a weight of the growing single crystal; and
   a distance measurement sensor for measuring a distance between the growing single crystal and the crucible screen.

7. The single crystal growing apparatus according to claim 5, wherein, if the weight of the grown single crystal has reached the predetermined reference weight, the controller performs a lift-off process for removing the grown single crystal from the crucible.

8. The single crystal growing apparatus according to claim 6, wherein the controller including a further distance measurement sensor for measure the cycling distance.

9. The single crystal growing apparatus according to claim 1, wherein the conveying unit includes:
   at least one jig for binding the crucible screen and the first upper thermal insulation part together; and
   a lifting part for raising or lowering the at least one jig.

10. The single crystal growing apparatus according to claim 9, wherein the at least one jig includes:
   a binding portion for surrounding the crucible screen and the first upper thermal insulation part together; and
   a support portion passing through the second upper thermal insulation part and having one end connected to the binding portion and a remaining end connected to the lifting part.

11. The single crystal growing apparatus according to claim 10, wherein the binding portion surrounds a top surface of the first upper thermal insulation part, an outer side surface of the first upper thermal insulation part, an outer side surface of the crucible screen, and at least a portion of a bottom surface of the crucible screen.

12. The single crystal growing apparatus according to claim 9, wherein the at least one jig is provided in a plural number, and the plurality of jigs are arranged apart from each other.

13. The single crystal growing apparatus according to claim 9, wherein the at least one jig passes through the first upper thermal insulation part and the second upper thermal insulation part, and has one end connected to the crucible screen and a remaining end connected to the lifting part.

14. The single crystal growing apparatus according to claim 1, wherein a bottom surface of the first upper thermal insulation part is in contact with a top surface of the crucible screen.

15. The single crystal growing apparatus according to claim 1, wherein the conveying unit raises or lowers the crucible screen and the first upper thermal insulation part together within a space between the first upper thermal insulation part and the second upper thermal insulation part.

* * * * *